United States Patent
Otsuka et al.

(10) Patent No.: US 7,504,911 B2
(45) Date of Patent: Mar. 17, 2009

(54) SURFACE ACOUSTIC WAVE RESONATOR, SURFACE ACOUSTIC WAVE DEVICE, AND COMMUNICATIONS EQUIPMENT

(75) Inventors: Kazuhiro Otsuka, Kyoto (JP); Daisuke Makibuchi, Kyoto (JP); Tsuyoshi Nakai, Kyoto (JP); Atsuomi Fukuura, Kyoto (JP); Hiroyuki Tanaka, Kyoto (JP); Ikuo Obara, Kyoto (JP); Kiyohiro Iioka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 280 days.

(21) Appl. No.: 11/442,660

(22) Filed: May 25, 2006

(65) Prior Publication Data

US 2007/0024397 A1    Feb. 1, 2007

(30) Foreign Application Priority Data

May 27, 2005  (JP)  ............................. 2005-155047
May 27, 2005  (JP)  ............................. 2005-155048
May 27, 2005  (JP)  ............................. 2005-155049

(51) Int. Cl.
*H03H 9/64*  (2006.01)
(52) U.S. Cl. ..................................... 333/195; 333/193
(58) Field of Classification Search .................. 333/193, 333/195; 310/313 B
See application file for complete search history.

(56) References Cited

U.S. PATENT DOCUMENTS 6,420,946 B1    7/2002    Bauer et al. .................. 333/193

2002/0017969 A1*   2/2002    Takamine ................... 333/193

FOREIGN PATENT DOCUMENTS

| EP | 1 168 614 A2 | 1/2002 |
|----|---|---|
| JP | 01-231417 | 9/1989 |
| JP | 04-040705 | 2/1992 |
| JP | 07-058581 | 3/1995 |
| JP | 08-250969 | 9/1996 |
| JP | 2002-009587 | 1/2002 |
| JP | 2002-528987 | 9/2002 |

\* cited by examiner

*Primary Examiner*—Daniel D Chang
(74) *Attorney, Agent, or Firm*—Hogan & Hartson LLP

(57) ABSTRACT

A plurality of IDT electrodes 2 to 7 each having a large number of electrode fingers extending in a direction perpendicular to a propagation direction of a surface acoustic wave propagating on a piezoelectric substrate 1 are arranged on the piezoelectric substrate 1 along the propagation direction, and each of the two adjacent IDT electrodes out of the plurality of IDT electrodes 2 to 7 comprises a variable pitch section and a fixed pitch section. The electrode finger pitch in the variable pitch section gradually decreases toward the boundary between the two adjacent IDT electrodes, and the minimum electrode finger pitch portion in the two variable pitch sections is on one side spaced apart from the boundary. There can be provided a surface acoustic wave apparatus having a large pass bandwidth, having a low insertion loss, and having improved flatness in a pass band.

15 Claims, 7 Drawing Sheets

SURFACE ACOUSTIC WAVE RESONATOR, SURFACE ACOUSTIC WAVE DEVICE, AND COMMUNICATIONS EQUIPMENT

BACKGROUND OF THE INVENTION

1. Field of the Invention

The present invention relates to a surface acoustic wave apparatus used for a surface acoustic wave filter or the like, and communications equipment comprising the same.

2. Description of Related Art

Conventionally, as frequency selecting filters used for RF stages in mobile communications equipment such as cellular phones and automobile telephones, surface acoustic wave filters have been widely used. Generally, as characteristics required of the frequency selecting filters, various characteristics such as wide pass bands, low losses, and high attenuations are listed.

In recent years, particularly in order to improve receiving sensitivity and reduce power consumption in the mobile communications equipment, requests to reduce the losses of the surface acoustic wave filters have increased. The reason for this is that in the mobile communications equipment, the transition of antennas for miniaturization from conventional whip antennas to built-in antennas using dielectric ceramics has occurred, which makes it difficult to sufficiently obtain the gains of the antennas, so that requests to further improve the insertion losses of the surface acoustic wave filters have increased.

In recent years, surface acoustic wave filters that can be miniaturized and made nonadjustable have been employed for various types of communications equipment. With the progress of high frequencies and high functions of the communications equipment, requests to widen pass bands in the surface acoustic wave filters have been increasing. For example, filters for cellular phones in 1.9 GHz bands, high-performance wide-band filters having effective pass bandwidths of not less than 80 MHz and having fractional bandwidths (the fractional bandwidth is defined by (bandwidth/center frequency): fractional bandwidth=bandwidth/center frequency) of not less than approximately 4% have been desired.

In order to realize wide pass bands, double-mode surface acoustic wave resonator filters having three IDT (Inter Digital Transducer) electrodes provided on a piezoelectric substrate and utilizing a longitudinal primary mode and a longitudinal ternary mode, for example, have been proposed.

FIG. 12 is a plan view showing an electrode configuration of a conventional resonator-type surface acoustic wave filter. FIG. 13 is a graph showing the relationship between the position of each electrode in the resonator-type surface acoustic wave filter shown in FIG. 12 (a horizontal axis) and the pitch between electrode fingers (a vertical axis).

An IDT electrode 204 having a plurality of electrode fingers arranged on a piezoelectric substrate 202 comprises a pair of comb-shaped electrodes in a state where they are opposed to each other and meshed with each other. An electric field is applied to the pair of comb-shaped electrodes, to generate a surface acoustic wave. An electric signal is inputted from an input terminal 215 connected to one of the comb-shaped electrodes in the IDT electrode 204, so that the excited surface acoustic wave propagates to IDT electrodes 203 and 205 arranged on both sides of the IDT electrode 204. Further, an electric signal is outputted to output terminals 216 and 217 through IDT electrodes 206 and 209 from one of comb-shaped electrodes composing each of the IDT electrodes 203 and 205.

Reference numerals 210, 211, 212, and 213 in FIG. 12 respectively denote reflector electrodes. The surface acoustic wave is reflected by the reflector electrodes 210, 211, 212, and 213 positioned at both ends, and is changed into standing waves between the reflector electrodes at both the ends.

Resonator electrode patterns are thus two-stage cascade-connected, so that an out-of-band attenuation serving as filter characteristics is increased by mutual interference between the respective standing waves in the first and second stages, and can be improved. That is, surface acoustic wave filters having the same characteristics are two-stage cascade-connected so that a signal attenuated in the first stage is further attenuated in the second stage, so that the out-of-band attenuation can be improved to approximately two times.

Conventionally, as a method that has been used for reducing the insertion loss of the surface acoustic wave filter and widening the pass band therein, the distance between adjacent IDT electrodes is shortened, or a narrow pitch section is provided at an end of the IDT electrode. However, a resonance mode generated in the pass band cannot be so adjusted as to be most suitably arranged merely by providing a section having a narrow electrode finger pitch at the end of the IDT electrode. Therefore, an insertion loss and flatness of the surface acoustic wave filter cannot be further sufficiently improved with a pass bandwidth kept large as important filter characteristics in the pass band.

Therefore, an object of the present invention is to provide a surface acoustic wave resonator and a surface acoustic wave apparatus having superior filter characteristics such as an insertion loss not increased and a large pass bandwidth and also functioning as a high-quality balance-type surface acoustic wave filter, and communications equipment using the same.

SUMMARY OF THE INVENTION

A surface acoustic wave resonator in the present invention is a surface acoustic wave resonator comprising a plurality of IDT electrodes arranged on a piezoelectric substrate along a propagation direction of a surface acoustic wave propagating on the piezoelectric substrate and each having a number of electrode fingers extending in a direction perpendicular to the propagation direction, wherein two adjacent IDT electrodes out of the plurality of IDT electrodes comprises a variable pitch section, that is a section in close proximity to an end of the other IDT electrode, where the pitch between the electrode fingers (hereinafter referred to as "electrode finger pitch") is variable, and a fixed pitch section, which is the remaining section, that the electrode finger pitch is fixed, the electrode finger pitch in the variable pitch section basically decreases toward the boundary between the two adjacent IDT electrodes, and the minimum electrode finger pitch portion in the two adjacent variable pitch sections is on one side spaced apart from the boundary.

This configuration further allows a radiation loss at the time of mode conversion of the surface acoustic wave into a bulk wave to be prevented in an area where the IDT electrodes are adjacent to each other and allows frequency spacing between primary and ternary modes and their higher harmonic modes to be further finely adjusted. Therefore, a surface acoustic wave apparatus having a wide band, a low loss, and good electrical characteristics can be realized.

The minimum electrode finger pitch portion in the two variable pitch sections is on one side spaced apart from the boundary, so that resonance frequencies can be arranged with a certain degree or more of frequency spacing by suitably arranging a resonance mode of the surface acoustic wave.

Therefore, the arrangement of the resonance frequencies, which is suitable for wide band characteristics, becomes easy, which is consequently advantageous in widening the pass band. Further, the appearance of the amplitude distribution of the particular surface acoustic wave can be restrained or increased. Thus, it is possible to carry out such control as to arrange a resonance peak in the pass band at the most suitable position and consequently, to control filter characteristics so as to improve flatness and reduce an insertion loss while widening the pass band.

In the above-mentioned configuration, if the average electrode finger pitch in the variable pitch section in one of the IDT electrodes is made shorter than the average electrode finger pitch in the variable pitch section in the other IDT electrode, it is possible to carry out such control as to suitably arrange the resonance peak of the generated surface acoustic wave between the adjacent IDT electrodes and to further most suitably prevent the radiation loss at the time of mode conversion of the surface acoustic wave into the bulk wave. Therefore, it is possible to improve the flatness and reduce the insertion loss while widening the pass band as filter characteristics in the pass band.

In the above-mentioned configuration, if the electrode finger pitch in the fixed pitch section in one of the two adjacent IDT electrodes is longer than the electrode finger pitch in the fixed pitch section in the other IDT electrode, and the minimum electrode finger pitch portion in the variable pitch sections is on the side of the one IDT electrodes, it is further possible to carry out such control as to suitably arrange the resonance peak of the generated surface acoustic wave between the adjacent IDT electrodes and to further most suitably prevent the radiation loss at the time of mode conversion of the surface acoustic wave into the bulk wave. Therefore, it is possible to improve the flatness and reduce the insertion loss while widening the pass band as filter characteristics in the pass band.

In the above-mentioned configuration, it is preferable that the electrode finger pitch in the fixed pitch section in one of the two adjacent IDT electrodes is longer than the electrode finger pitch in the fixed pitch section in the other IDT electrode, and the average electrode finger pitch in the variable pitch section in the one IDT electrode is shorter than the average electrode finger pitch in the variable pitch section in the other IDT electrode. In this case, it is further possible to arrange a plurality of resonance peaks of the generated surface acoustic wave to the most suitable frequencies between the adjacent IDT electrodes. Therefore, it is possible to improve the flatness and reduce the insertion loss while widening the pass band as filter characteristics in the pass band.

A plurality of minimal electrode finger pitch portions exist in the two adjacent variable pitch sections. Therefore, it is possible to generate a plurality of resonance modes of the surface acoustic wave between the adjacent IDT electrodes, adjust the resonance modes of the surface acoustic wave so as to suitably arrange the resonance modes, and arrange resonance frequencies with a certain degree or more of frequency spacing. That is, the arrangement of the resonance frequencies, which is suitable for wide band characteristics, becomes easy, which is consequently advantageous in widening the pass band. Further, the appearance of the amplitude distribution of the particular surface acoustic wave can be restrained or increased. Therefore, the plurality of resonance peaks in the pass band can be arranged at the most suitable frequency positions. As a result, it is possible to control filter characteristics so as to improve the flatness and reduce the insertion loss while widening the pass band.

In the above-mentioned configuration, the minimum one of the plurality of minimal electrode finger pitch portions in the two variable pitch sections is on one side spaced apart from the boundary between the two adjacent IDT electrodes. Thus, it is possible to arrange the resonance peak of the generated surface acoustic wave at a suitable frequency between the adjacent IDT electrodes. Therefore, it is possible to improve the flatness and reduce the insertion loss while widening the pass band as filter characteristics in the pass band.

At least one of the two adjacent variable pitch sections comprises a "wide pitch region" having an electrode finger pitch wider than the electrode finger pitch in the fixed pitch section. Thus, resonance frequencies can be arranged with a certain degree or more of frequency spacing by arranging the resonance mode of the surface acoustic wave at a suitable frequency, that is, the arrangement of the resonance frequencies, which is suitable for wide band characteristics, becomes easy, which is consequently advantageous in widening the pass band.

The appearance of the amplitude distribution of the particular surface acoustic wave can be restrained or increased. Therefore, the resonance peak in the pass band can be arranged at the most suitable frequency position. As a result, it is possible to control filter characteristics so as to improve the flatness and reduce the insertion loss while widening the pass band.

The wide pitch region is in an area, on the side of the boundary between the variable pitch section and the fixed pitch section, of the variable pitch section, so that the selectivity of the arrangement of the resonance peak is similarly increased. Therefore, the insertion loss can be reduced by arranging the resonance peak at a suitable frequency position.

A surface acoustic wave apparatus according to the present invention is a surface acoustic wave apparatus having a surface acoustic wave resonator, described above, and an input/output terminal connected to the surface acoustic wave resonator.

In the above-mentioned configuration, if a surface acoustic wave resonator comprising an IDT electrode and reflector electrodes with the IDT electrode sandwiched therebetween for generating one or more mode resonances is connected in series or in parallel with the IDT electrodes composing the surface acoustic wave resonator, impedance matching can be achieved. Thus, it is possible to form an attenuation pole by connecting the surface acoustic wave resonator. Therefore, characteristics can be controlled so as to satisfy specifications required for an out-of-band attenuation to be increased while widening the pass band, flattening the pass band, and reducing the insertion loss.

Surface acoustic wave resonators having the above-mentioned configuration are two-stage cascade-connected, so that the number of paths connecting the first stage and the second stage, for example, can be increased. Thus, the degree of design freedom of the pass band is increased by overlapping the resonance modes of the generated surface acoustic wave, and the out-of-band attenuation can be increased. Therefore, it is possible to improve the flatness and reduce the insertion loss with the pass bandwidth kept large more effectively.

There can be provided a surface acoustic wave apparatus having the function of an unbalance-balance signal converter by dividing a common electrode that is a part of an IDT electrode in a surface acoustic wave resonator into electrodes to be respectively connected to balance output terminals.

Communications equipment according to the present invention is communications equipment comprising at least one of a receiving circuit and a transmission circuit, wherein the above-mentioned surface acoustic wave resonator or surface acoustic wave apparatus according to the present invention is carried thereon. This configuration allows communications equipment capable of satisfying a strict insertion loss conventionally required to be obtained, and allows communications equipment having reduced power consumption and having significantly good sensitivity to be realized.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Figure 1:
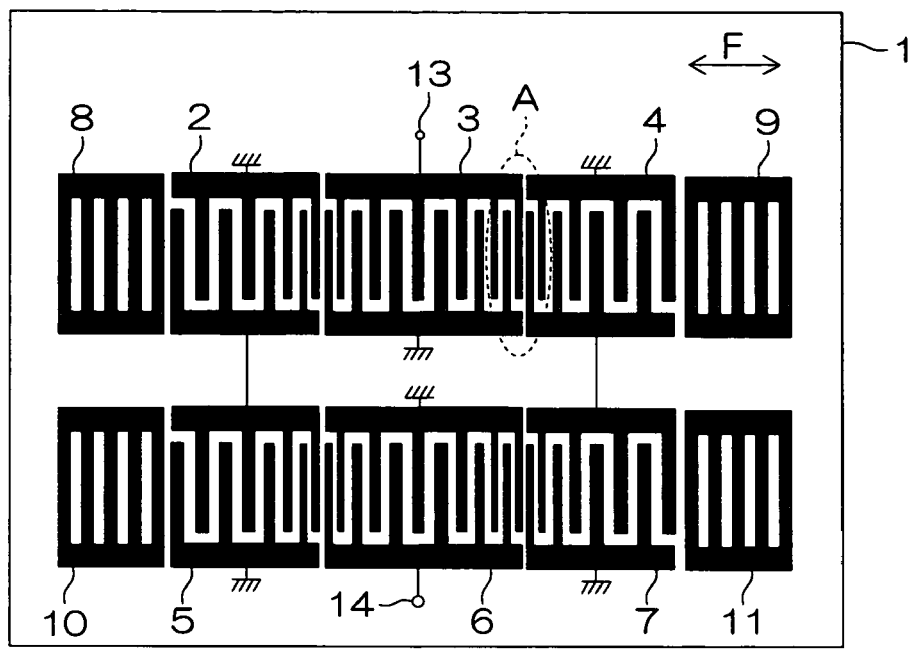
FIG. 1 is a plan view showing an electrode pattern of a surface acoustic wave apparatus according to an embodiment of the present invention.

In the drawings, described below, the size of each of electrodes, the distance between the electrodes, the number of electrode fingers, the spacing between the electrode fingers, and so on are schematically shown for illustrative purposes.

FIG. 1 is a plan view showing the electrode configuration of a surface acoustic wave apparatus according to the present invention.

The surface acoustic wave apparatus is so configured that surface acoustic wave resonators in upper and lower two stages are arranged on a piezoelectric substrate 1.

The surface acoustic wave resonator in each of the stages is configured by respectively arranging a plurality of IDT electrodes 2 to 4 and a plurality of IDT electrodes 5 to 7 each having a large number of electrode fingers extending in a direction perpendicular to a propagation direction F of a surface acoustic wave propagating on the piezoelectric substrate 1 along the propagation direction F. Further, reflector electrodes 8 and 9 with the IDT electrodes 2 to 4 sandwiched on both sides and reflector electrodes 10 and 11 with the IDT electrodes 5 to 7 sandwiched on both sides are arranged. Reference numeral 13 denotes an input signal terminal connected to the IDT electrode 3, and reference numeral 14 denotes an output signal terminal connected to the IDT electrode 6.

The surface acoustic wave apparatus has a two-stage configuration in which the two IDT electrodes 2 and 4 in the surface acoustic wave resonator in the first stage are respectively cascade-connected to the two IDT electrodes 5 and 7 in the surface acoustic wave resonator in the second stage.

Although each of the IDT electrodes 2 to 7 and the reflector electrodes 8 to 11 has several to several hundred electrode fingers, the electrode fingers are illustrated in simplified fashion.

Figure 2:
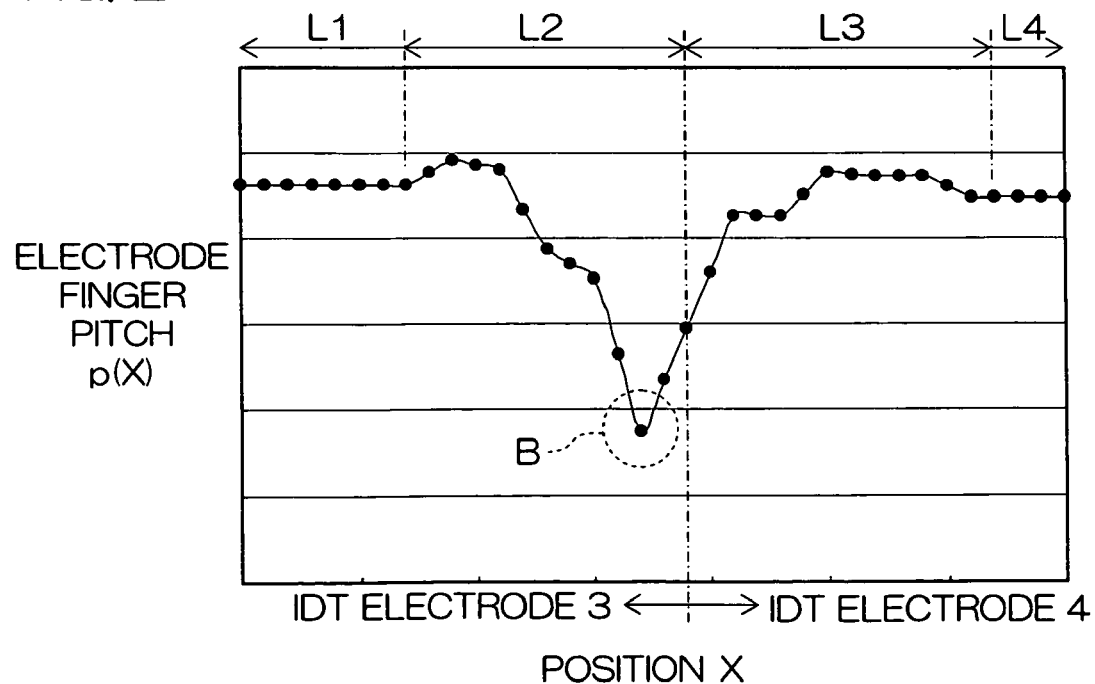
FIG. 2 is a graph showing the distribution of an electrode finger pitch in adjacent IDT electrodes.

FIG. 2 is a graph showing, in a portion A where the IDT electrodes 3 and 4 in the surface acoustic wave resonator are adjacent to each other, the change of the pitch between the electrode fingers (electrode finger pitch) in the IDT electrode. A position x along a propagation direction F of the surface acoustic wave is used to enter the horizontal axis. A one-dot and dash line in the middle indicates the boundary between the adjacent IDT electrodes 3 and 4.

Each of the IDT electrodes 2 to 7 comprises a "variable pitch section" where the electrode finger pitch is variable and a "fixed pitch section" where the electrode finger pitch is fixed.

The variable pitch section exists, in one of the adjacent IDT electrodes (the IDT electrodes 2 and 3, the IDT electrodes 3 and 4, the IDT electrodes 5 and 6, and the IDT electrodes 6 and 7), close to an end of the other IDT electrode.

When the IDT electrodes 3 and 4, for example, are paid attention to, L2 and L3 that are close to the boundary between the two adjacent IDT electrodes 3 and 4 respectively correspond to the variable pitch sections, and L1 and L4 that are spaced apart from the boundary respectively correspond to the fixed pitch sections, as shown in FIG. 2.

In the present embodiment, the average electrode finger pitch in the variable pitch section is made shorter than the electrode finger pitch in the fixed pitch section. In the example shown in FIG. 2, the average electrode finger pitch in the variable pitch section L2 is shorter than the electrode finger pitch in the fixed pitch section L1, and the average electrode finger pitch in the variable pitch section L3 is shorter than the electrode finger pitch in the fixed pitch section L4. Correspondingly, the electrode finger pitch in the variable pitch sections L2 and L3 gradually decreases toward the boundary, as shown in FIG. 2.

Therefore, the occupied area of the electrode fingers on the piezoelectric substrate 1 can be adjusted in a portion where the IDT electrodes (the IDT electrode 3 and the IDT electrode 4 in the example shown in FIG. 2) are adjacent to each other. Further, the frequency difference between resonance primary and ternary modes and their higher harmonic modes can be finely adjusted.

This allows a plurality of resonance peaks of the generated surface acoustic wave to be arranged at the most suitable frequencies between the adjacent IDT electrodes, which can prevent a radiation loss based on mode conversion of the surface acoustic wave into a bulk wave. Consequently, a wide-band and low-loss surface acoustic wave apparatus having good electrical characteristics can be realized.

The minimum electrode finger pitch portion is on one side spaced apart from the boundary. Specifically, the minimum electrode finger pitch portion B is in the variable pitch section L2 spaced apart from the boundary between the IDT electrode 3 and the IDT electrode 4, as shown in FIG. 2.

This configuration allows the resonance peaks in a pass band to be arranged at the most suitable positions with a certain degree or more of frequency spacing utilizing a region having a wide electrode finger pitch in the variable pitch section and the minimum portion B on one side spaced apart from the boundary between the two adjacent IDT electrodes. Thus, the appearance of the amplitude distribution of the particular surface acoustic wave can be restrained or increased. Consequently, it is possible to widen the pass band, flatten the pass band, and reduce the insertion loss.

The above-mentioned configuration (configuration in which the electrode finger pitch in the variable pitch section gradually decrease toward the boundary, and the minimum electrode finger pitch portion is on one side spaced apart from the boundary; which is referred to as a "configuration A") may be employed in at least one of pairs of two adjacent IDT electrodes (e.g., a pair of IDT electrodes 3 and 4).

In improving the symmetry of electrical characteristics of the surface acoustic wave apparatus, however, it is preferable that the configuration A is employed in all pairs of two adjacent IDT electrodes in the one surface acoustic wave resonator (e.g., the IDT electrodes 2 and 3 and the IDT electrodes 3 and 4 in the surface acoustic wave resonator in the first stage).

In the two adjacent IDT electrodes (the IDT electrodes 2 and 3, the IDT electrodes 3 and 4, the IDT electrodes 5 and 6, and the IDT electrodes 6 and 7), it is preferable that the minimum electrode finger pitch portion B is on the side of one of the IDT electrodes, and the electrode finger pitch in the fixed pitch section in the one IDT electrode is longer than the electrode finger pitch in the fixed pitch section in the other IDT electrode.

In the example shown in FIG. 2, the electrode finger pitch in the fixed pitch section L1 on the side of the IDT electrode 3 is longer than that in the fixed pitch section L4 on the side of the IDT electrode 4. This allows the resonance peaks of the generated surface acoustic wave to be further suitably arranged between the adjacent IDT electrodes in corporation with the fact that the minimum electrode finger pitch portion B is on the side of the one IDT electrodes 3, which can realize improvements in filter characteristics such as widening of the pass band, flattening of the pass band, and reduction in the insertion loss.

It is preferable that out of the two adjacent IDT electrodes, the electrode finger pitch in the fixed pitch section in one of the IDT electrodes is longer than the electrode finger pitch in the fixed pitch section in the other IDT electrode, and the average electrode finger pitch in the variable pitch section in the one IDT electrode is shorter than the average electrode finger pitch in the variable pitch section in the other IDT electrode.

In the example shown in FIG. 2, the electrode finger pitch in the fixed pitch section L1 on the side of the IDT electrode 3 is longer than that in the fixed pitch section L4 on the side of the IDT electrode 4. Further, the average electrode finger pitch in the variable pitch section L2 on the side of the IDT electrode 3 is shorter than the average electrode finger pitch in the variable pitch section L3 on the side of the IDT electrode 4.

This configuration allows the resonance peaks of the generated surface acoustic wave to be further suitably arranged between the adjacent IDT electrodes, which can further realize improvements in filter characteristics such as widening of the pass band, flattening of the pass band, and reduction in the insertion loss.

Figure 3:
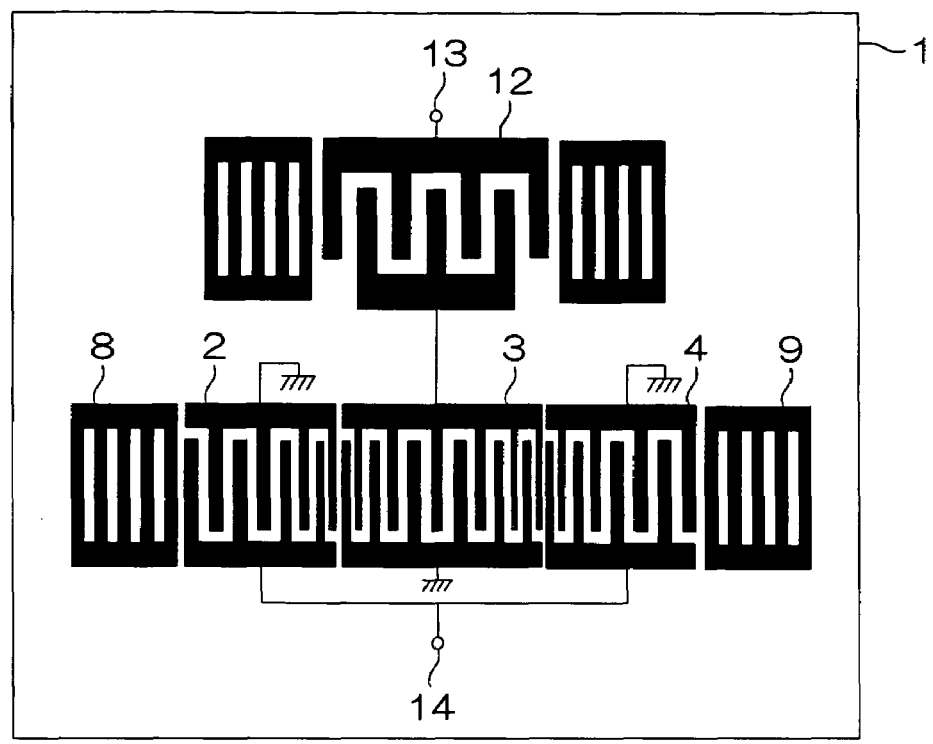
FIG. 3 is a plan view showing an electrode pattern of a surface acoustic wave apparatus according to another embodiment of the present invention.

FIG. 3 is a plan view showing the electrode configuration according to a modified example of the surface acoustic wave apparatus according to the present invention. The surface acoustic wave apparatus is so configured that surface acoustic wave resonators in upper and lower two stages are arranged on a piezoelectric substrate 1.

As shown in FIG. 3, the surface acoustic wave resonator in the lower stage comprises IDT electrodes 2 and 4 arranged in series or in parallel (in series in the example shown in FIG. 3) with an IDT electrode 3 and reflector electrodes 8 and 9 arranged with the IDT electrodes 2 to 4 sandwiched therebetween. The surface acoustic wave resonator 12 in the upper stage for generating one or more mode resonances comprises an IDT electrode and reflector electrodes arranged with the IDT electrode sandwiched therebetween. The IDT electrode 3 is connected to the resonator 12.

At least one of the two adjacent IDT electrodes (IDT electrodes 2 and 3 or IDT electrodes 3 and 4) in the surface acoustic wave resonator in the lower stage has a "configuration A", described above.

According to the surface acoustic wave apparatus having this configuration, impedance matching between an input signal terminal 13 and an output signal terminal 14 can be achieved. Thus, it is possible to form an attenuation pole to be formed by connecting the resonator (surface acoustic wave resonator) 12. Therefore, characteristics can be controlled so as to satisfy specifications required for an out-of-band attenuation to be increased while widening a pass band, flattening the pass band, and reducing an insertion loss. That is, the effect of the configuration shown in FIG. 1 in the present invention (the improvement in the insertion loss and widening of the pass band) is further multiplied by the effect of increasing the out-of-band attenuation.

Figure 4:
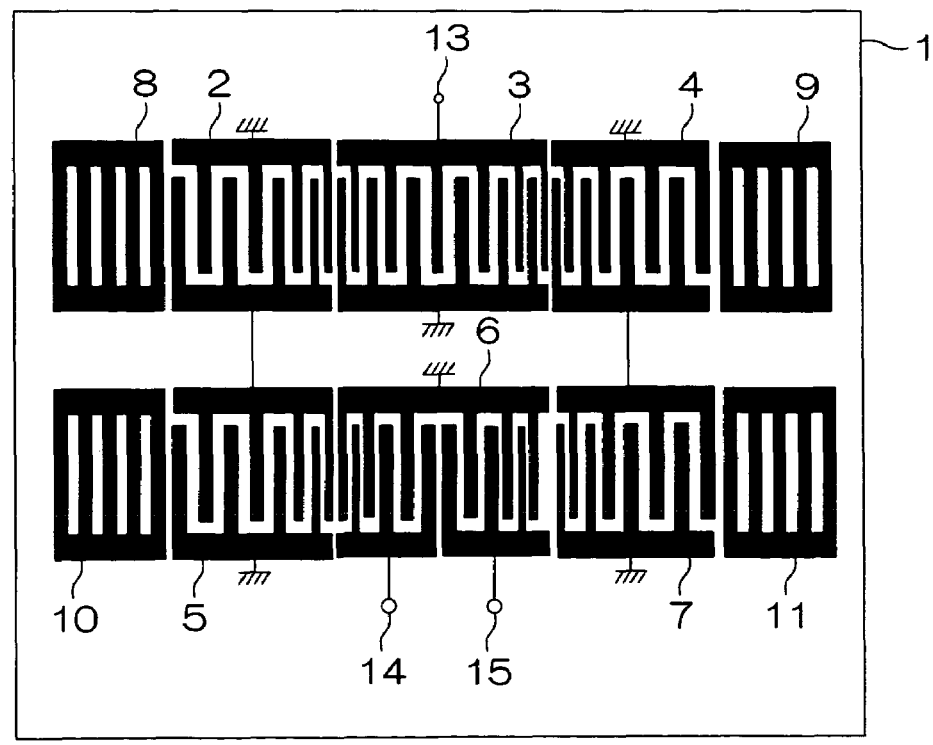
FIG. 4 is a plan view showing an electrode pattern of a surface acoustic wave apparatus according to still another embodiment of the present invention.

FIG. 4 is a plan view showing still another electrode configuration of the surface acoustic wave apparatus according to the present invention. The surface acoustic wave apparatus is so configured that surface acoustic wave resonators in upper and lower two stages are arranged on a piezoelectric substrate 1. An IDT electrode 6 at the center of the surface acoustic wave resonator 5 in the second stage is divided into two electrodes to be respectively connected to two balance output terminals 14 and 15.

Surface acoustic wave resonators are two-stage cascade-connected, so that the number of paths connecting the first stage and the second stage, for example, can be increased. Thus, the degree of design freedom of a pass band is increased by overlapping resonance modes of a generated surface acoustic wave, and an out-of-band attenuation can be increased. Therefore, it is possible to improve flatness and an insertion loss with a pass bandwidth kept large more effectively.

There can be provided a surface acoustic wave apparatus having the function of an unbalance-balance signal converter by dividing a common electrode that is a part of the IDT electrode in the surface acoustic wave resonator in the second stage into electrodes to be respectively connected to balance output terminals 14 and 15.

That is, the effect of the configuration shown in FIG. 1 in the present invention (the improvement in the insertion loss and widening of the pass band) is further similarly multiplied by the effect of increasing the out-of-band attenuation and the addition of an unbalance-balance input/output conversion function.

Figure 5:
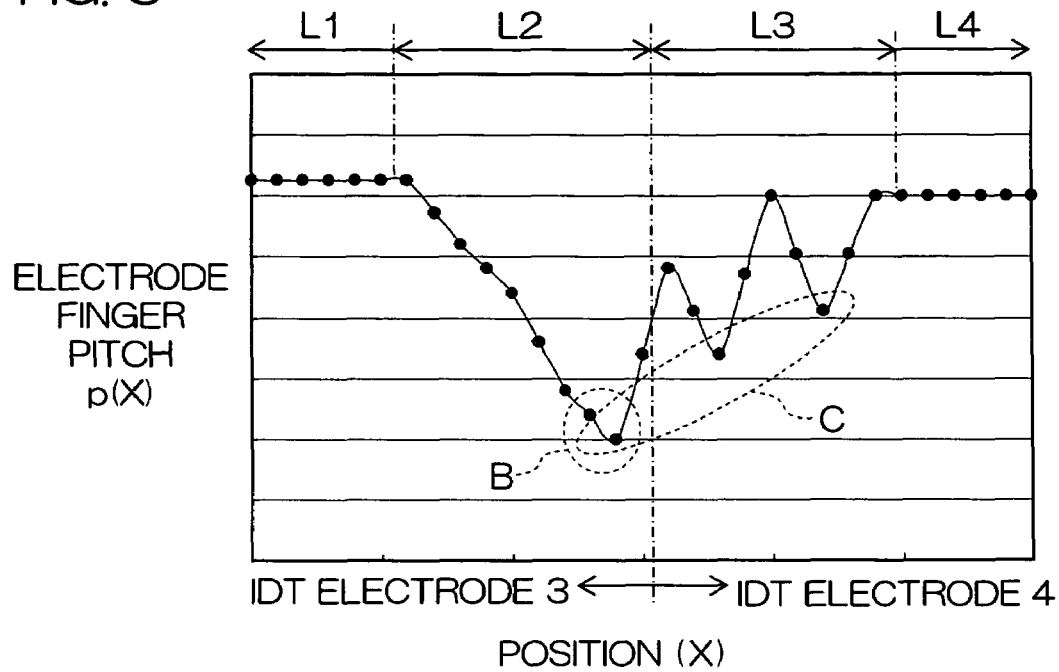
FIG. 5 is a graph showing the distribution of an electrode finger pitch in adjacent IDT electrodes.

FIG. 5 is a graph showing another modified example of the electrode finger pitch in the IDT electrode in the electrode configuration of the surface acoustic wave apparatus. The configuration of the surface acoustic wave apparatus is basically the same as the configuration of the surface acoustic wave apparatus shown in FIG. 1.

As shown in FIG. 5, the average electrode finger pitch in the variable pitch sections L2 and L3 is made shorter than the electrode finger pitch in the fixed pitch sections L1 and L4. The electrode finger pitch in the variable pitch sections L2 and L3 gradually decreases toward the boundary between the two adjacent IDT electrodes 3 and 4, which is the same as the tendency shown in FIG. 2.

FIG. 5 differs from FIG. 2 in that there are a plurality of minimal electrode finger pitch portions in the two variable pitch sections L2 and L3. That is, a plurality of minimal electrode finger pitch portions C exist across the IDT electrodes 3 and 4, as shown in FIG. 5. In the present invention, the plurality of minimal electrode finger pitch portions C may exist in one of the IDT electrodes 3 and 4.

It is preferable that the number of minimal electrode finger pitch portions C and the electrode finger pitch are respectively set to the most suitable values. Specifically, it is preferable in suitably arranging resonance peaks within a pass band to widen the pass band and reduce an insertion loss that the number of minimal electrode finger pitch portions is 2 to 4.

According to the present embodiment, the minimum one of the plurality of minimal electrode finger pitch portions in the two variable pitch sections is on one side spaced apart from the boundary between the two adjacent IDT electrodes. Specifically, the minimum portion B is on the side of the IDT electrode 3, as shown in FIG. 5.

This configuration allows resonance frequencies to be arranged with a certain degree or more of frequency spacing by generating a plurality of resonance modes of the surface acoustic wave and arranging the resonance modes of the surface acoustic wave at the most suitable frequencies. That is, the arrangement of the resonance frequencies, which is suitable for wide band characteristics, becomes easy, which is consequently advantageous in widening the pass band in the surface acoustic wave apparatus.

Figure 6:
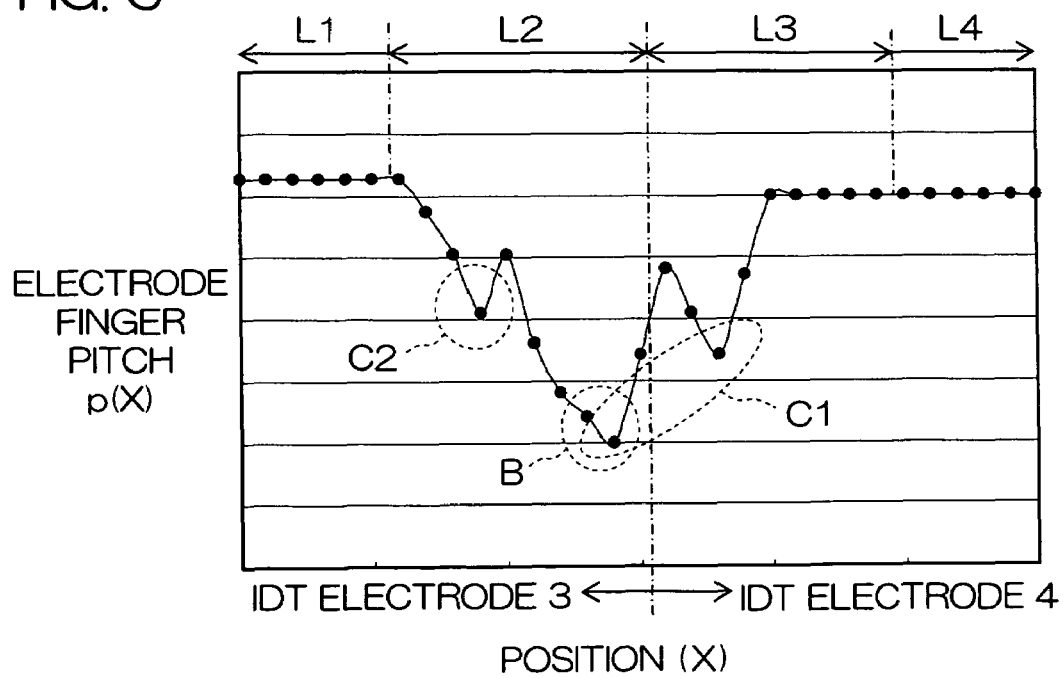
FIG. 6 is a graph showing the distribution of an electrode finger pitch in adjacent IDT electrodes.

Furthermore, FIG. 6 is a graph showing still another modified example of the electrode finger pitch in the IDT electrode in the electrode configuration A of the surface acoustic wave resonator.

FIG. 6 differs from FIG. 5 in that in the two variable pitch sections L2 and L3, a plurality of minimal electrode finger pitch portions C1 and C2 exist across the IDT electrode 3 and the IDT electrode 4, and the minimal electrode finger pitch portions C1 and C2 exist on both sides of the minimum portion B.

This configuration allows resonance frequencies to be arranged with a certain degree or more of frequency spacing by generating a plurality of resonance modes of the surface acoustic wave between the adjacent IDT electrodes and suitably arranging and adjusting the resonance modes of the surface acoustic wave. That is, the arrangement of the resonance frequencies, which is suitable for wide band characteristics, becomes easy, which is consequently advantageous in widening the pass band.

Furthermore, the appearance of the amplitude distribution of the particular surface acoustic wave can be restrained or increased, thereby making it possible to carry out such control that a plurality of resonance peaks in the pass band are arranged at the most suitable frequency positions and consequently, to control filter characteristics so as to improve flatness and an insertion loss while widening the pass band.

That is, the selectability of the arrangement of the resonance peaks is increased by providing the plurality of minimal electrode finger pitch portions, and the insertion loss can be improved by arranging the resonance peaks at the suitable frequency positions, similarly to the above-mentioned effect in a case where the minimum portion is spaced apart from the boundary.

Figure 7:
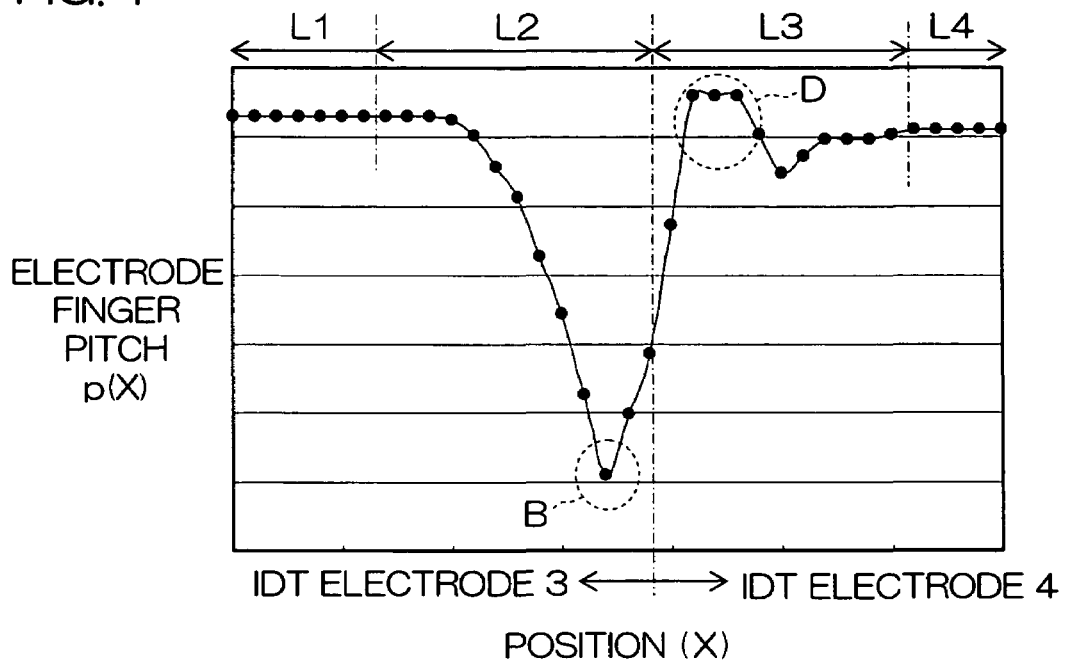
FIG. 7 is a graph showing the distribution of an electrode finger pitch in adjacent IDT electrodes.

FIG. 7 is a graph showing still another modified example of the electrode finger pitch in the IDT electrode in the electrode configuration A of the surface acoustic wave resonator.

The average electrode finger pitch in variable pitch sections L2 and L3 is shorter than the electrode finger pitch in fixed pitch sections L1 and L4, and the average electrode finger pitch in the variable pitch sections L2 and L3 gradually decreases toward the boundary between the two adjacent IDT electrodes 3 and 4, which is the same as the relationship shown in FIG. 2.

FIG. 7 differs from FIG. 2 in that one of the two variable pitch sections L2 and L3 (the variable pitch section L3) comprises a wide pitch region having an electrode finger pitch wider than the electrode finger pitch in the fixed pitch section L4. That is, a portion D in the variable pitch section L3 in the IDT electrode 4 is a wide pitch region D having an electrode finger pitch wider than the electrode finger pitch in the fixed pitch section L4, as shown in FIG. 7.

This configuration allows resonance frequencies to be arranged with a certain degree or more of frequency spacing by suitably arranging and adjusting the resonance modes of the surface acoustic wave. That is, the arrangement of the resonance frequencies, which is suitable for wide band characteristics, becomes easy, which is consequently advantageous in widening the pass band. Further, the appearance of the amplitude distribution of the particular surface acoustic wave can be restrained or increased.

Consequently, it is possible to carry out such control that the resonance peak in the pass band is arranged at the most suitable position and consequently, to control filter characteristics so as to widen the pass band, flatten the pass band, and reduce the insertion loss.

The wide pitch region D may exist in an area, on the side of the boundary between the variable pitch section L2 and the fixed pitch section L1 (an area in close proximity to the boundary), of the variable pitch section L3, as indicated by D2 in FIG. 8 later. The wide pitch regions D are interposed between ends of the variable pitch sections (L2, L3), so that the selectability of the arrangement of the resonance peak is increased, as described above, and the insertion loss can be reduced by arranging the resonance peak to the suitable frequency position, as in the foregoing.

Figure 8:
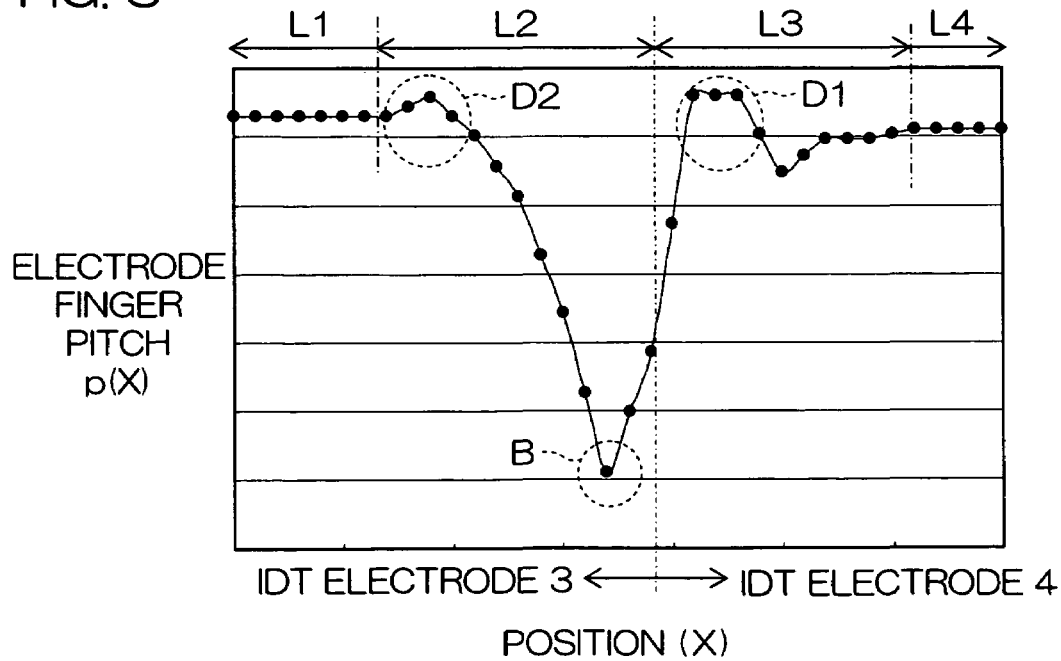
FIG. 8 is a graph showing the distribution of an electrode finger pitch in adjacent IDT electrodes.

FIG. 8 is a graph showing a modified example of an electrode finger pitch in which both two variable pitch sections L2 and L3 respectively comprise wide pitch regions D1 and D2 having an electrode finger pitch wider than the electrode finger pitch in fixed pitch sections L1 and L4.

As shown in FIG. 8, the variable pitch section L3 in an IDT electrode 4 comprises a wide pitch region D1 having an electrode finger pitch wider than the electrode finger pitch in the fixed pitch section L4, and the variable pitch section L2 in an IDT electrode 3 comprises a wide pitch region D2 having an electrode finger pitch wider than the electrode finger pitch in the fixed pitch section L1.

The minimum electrode finger pitch portion B in the variable pitch sections L2 and L3 is arranged at the most suitable frequency position while inserting the wide pitch regions D1 and D2 into the variable pitch sections L2 and L3 serving as narrow pitch sections. This configuration allows the appearance of the amplitude distribution of the particular surface acoustic wave to be restrained or increased.

Consequently, it is possible to further carry out such control that a plurality of resonance peaks in the pass band are respectively arranged at the most suitable frequency positions, to control the number of resonance peaks of the generated surface acoustic wave and their intensity distribution and consequently, to further control filter characteristics so as to widen the pass band, flatten the pass band, and reduce the insertion loss.

The length along a propagation direction of the surface acoustic wave in the wide pitch region D is preferably a length that is approximately 8 to 35% of the length of the one variable pitch section. When the length exceeds this range, it is considered that the effect of reducing the insertion loss is reduced.

Furthermore, it is preferable that the wide pitch region D has a pitch that is approximately 1.1 to 1.5 times the electrode finger pitch in the fixed pitch section. When the pitch exceeds this range, it is considered that the effect of reducing the insertion loss is reduced.

Description is then made of a material for the surface acoustic wave apparatus according to the embodiment of the present invention and a method of manufacturing the same.

A 36°±3° Y-cut X-propagation lithium tantalate single crystal, a 42°±3° Y-cut X-propagation lithium tantalate single crystal, a 64°±3° Y-cut X-propagation lithium niobate single crystal, a 41°±3° Y-cut X-propagation lithium niobate single crystal, or a 45°±3° X-cut Z-propagation lithium tetraborate single crystal is preferable as the piezoelectric substrate 1 for the surface acoustic wave filter because it has a high electromechanical coupling coefficient and has a low frequency temperature coefficient.

It is preferable that the thickness of the piezoelectric substrate 1 is approximately 0.1 to 0.5 mm. The piezoelectric substrate 1 is unsuitable for use because it is made brittle when the thickness thereof is less than 0.1 mm and increases in material cost and component dimensions when it exceeds 0.5 mm.

The IDT electrodes 2 to 7 and the reflector electrodes 8 to 11 are composed of Al or an Al alloy (a Al—Cu-based or an Al—Ti-based), and are formed on the piezoelectric substrate 1 using a thin film forming method such as an evaporation method, a sputtering method, or a CVD (Chemical Vapor Deposition) method. It is appropriate in obtaining characteristics as the surface acoustic wave filter that the thicknesses of the electrodes are approximately 0.1 to 0.5 µm.

Furthermore, it is also possible to prevent energization and improve power resistance using conductive foreign matter by forming $SiO_2$, SiNx, Si, or $Al_2O_3$ as a protective film in the IDT electrodes 2 to 7 and the reflector electrodes 8 to 11 and a surface acoustic wave propagation section on the piezoelectric substrate 1.

The piezoelectric substrate 1 composed of a piezoelectric single crystal having pyroelectric properties significantly reduced by oxygen defects and solubility of Fe or the like is good in device reliability.

The surface acoustic wave apparatus according to the present invention is applicable to communications equipment.

The communications equipment may be communications equipment comprising a transmission circuit for attenuating an unnecessary signal with a band-pass filter with a transmission signal on a carrier frequency with a mixer, then amplifying the transmission signal with a power amplifier, and transmitting the amplified transmission signal with an antenna through a duplexer. Alternatively, the communications equipment may be communications equipment comprising a receiving circuit for receiving a receiving signal with an antenna, amplifying the receiving signal that has passed through the duplexer with a low-noise amplifier, then attenuating an unnecessary signal through the band-pass filter, separating a signal from a carrier frequency with a mixer, and extracting the signal.

The surface acoustic wave apparatus according to the present invention can be used as a band-pass filter carried on the receiving circuit or the transmission circuit. If the surface acoustic wave apparatus according to the present invention is employed, there can be provided superior communications equipment having improved selectivity and sensitivity.

Although in the above-mentioned embodiment, an example in which three IDT electrodes each having a large number of electrode fingers extending in a direction perpendicular to the propagation direction of the surface acoustic wave propagating on the piezoelectric substrate 1 along the propagation direction per stage of the surface acoustic wave resonator is illustrated for simplicity, the present invention is not limited to the same. Two or four or more IDT electrodes may be arranged per stage of the surface acoustic wave resonator. In the other configuration, suitable changes can be made without departing from the scope of the present invention.

Examples of the present invention will be described below.

EXAMPLE 1

An example in which the surface acoustic wave apparatus shown in FIG. 1 is specifically manufactured will be described.

In the surface acoustic wave apparatus, each of two adjacent IDT electrodes 3 and 4 comprises variable pitch sections L2 and L3, which are sections in close proximity to an end of the other IDT electrode, where the electrode finger pitch is variable and fixed pitch sections L1 and L4, which are the remaining sections, where the electrode finger pitch is fixed and is different from that in the variable pitch sections. The electrode finger pitch in the variable pitch sections L2 and L3 decreases toward the boundary between the variable pitch sections, and the minimum electrode finger pitch portion B is on one side spaced apart from the boundary.

A fine electrode pattern composed of an Al (99 mass %)-Cu (1 mass %) alloy was formed on a piezoelectric substrate 1 composed of a 38.7° Y-cut X-propagation $LiTaO_3$ single crystal.

The electrode finger pitch in the adjacent IDT electrodes 3 and 4 in the vicinity of the boundary between the IDT electrodes 3 and 4 had a profile as shown in FIG. 2.

On the side of the IDT electrode 3, the average electrode finger pitch in the variable pitch section L2 was 2.15 µm, and the electrode finger pitch in the fixed pitch section L1 was set to 2.28 µm.

Furthermore, on the side of the IDT electrode 4, the average electrode finger pitch in the variable pitch section L3 was 2.20 µm, and the electrode finger pitch in the fixed pitch section L4 was set to 2.25 µm.

The minimum electrode finger pitch portion B in the two variable pitch sections L2 and L3 was on one side (on the side of the section L2) spaced 4.00 µm apart from the boundary therebetween (indicated by a one-dot and dash line). The electrode finger pitch at the minimum portion B was 1.97 µm.

The average electrode finger pitch in the reflector electrodes 8 to 11 arranged on both sides of each of the surface acoustic wave resonators was set to 2.13 µm.

In order to produce the pattern of each of the electrodes, the electrode was subjected to photolithography by means of a sputtering device, a reduced projection exposure device (a stepper), and an RIE (Reactive Ion Etching) device.

First, the piezoelectric substrate 1 was ultrasonically cleaned using acetone, IPA (isopropyl alcohol), or the like, to drop an organic component. The piezoelectric substrate 1 was then sufficiently dried by a clean oven, and a metal layer serving as each of the electrodes was then deposited. A sputtering device was employed for depositing the metal layer, and an Al (99 mass %)-Cu (1 mass %) alloy was used as a material for the metal layer. The thickness of the metal layer at this time was set to approximately 0.33 µm.

The metal layer was then spin-coated with a photoresist to a thickness of approximately 0.5 µm, to pattern the photoresist to a desired shape by the reduced projection exposure device (stepper), and the photoresist in an unnecessary portion was melted using an alkali developing solution by a developing device, to express a desired pattern. Thereafter, the metal layer was etched by the RIE device, to terminate the patterning, thereby obtaining a pattern of each of the electrodes composing the surface acoustic wave apparatus.

Thereafter, a protective film was formed on a predetermined region of each of the electrodes. That is, an $SiO_2$ film was formed to a thickness of approximately 0.02 µm on the pattern of the electrode and the piezoelectric substrate 1 by a CDV (Chemical Vapor Deposition) device.

Thereafter, patterning was performed by photolithography, and a flip-chip window opening section was etched by the RIE device or the like. Thereafter, the sputtering device was employed, to deposit a pad electrode mainly composed of Al. The thickness of the pad electrode at this time was set to approximately 1.0 µm. Thereafter, the photoresist and Al in the unnecessary portion were simultaneously removed by a lift-off method, to form a pad electrode for forming a conductor bump for flip-chipping the surface acoustic wave apparatus on an external circuit board or the like.

A flip-chip conductor bump composed of Au was then formed on the pad electrode using a bump bonding device. The diameter of the conductor bump was approximately 80 µm, and the height thereof was approximately 30 µm.

The piezoelectric substrate 1 was then subjected to dicing processing along a split line, and was divided for each surface acoustic wave apparatus (chip). Thereafter, each of chips was accommodated within a package to adhere thereto with its electrode pad formation surface taken as its lower surface by a flip-chip mounting device, followed by baking within an atmosphere of $N_2$ gas, to complete a packaged surface acoustic wave apparatus. Used as the package was one having a stacked structure 2.5×2.0 mm square (as viewed from the top) formed by stacking a large number of ceramic layers.

Manufactured as a comparative example in the same processes as the foregoing processes was a surface acoustic wave apparatus in which each of two adjacent IDT electrodes as shown in FIG. 1 does not comprise a variable pitch section and a fixed pitch section, and an electrode finger pitch in the IDT electrodes is fixed. The electrode finger pitch was 2.20 µm in the IDT electrodes 2, 4, 5, and 7, and was 2.28 µm in the IDT electrodes 3 and 6.

The respective characteristics of the surface acoustic wave apparatuses in the example and the comparative example were measured. A signal of 0 dBm was inputted, to make measurements under conditions of frequencies of 780 to 960 MHz and 800 measuring points. The number of samples was 30. Used as measuring equipment was Multi-Port Network Analyzer ("E5071A" manufactured by AGILENT TECHNOLOGIES INC)).

Figure 9:
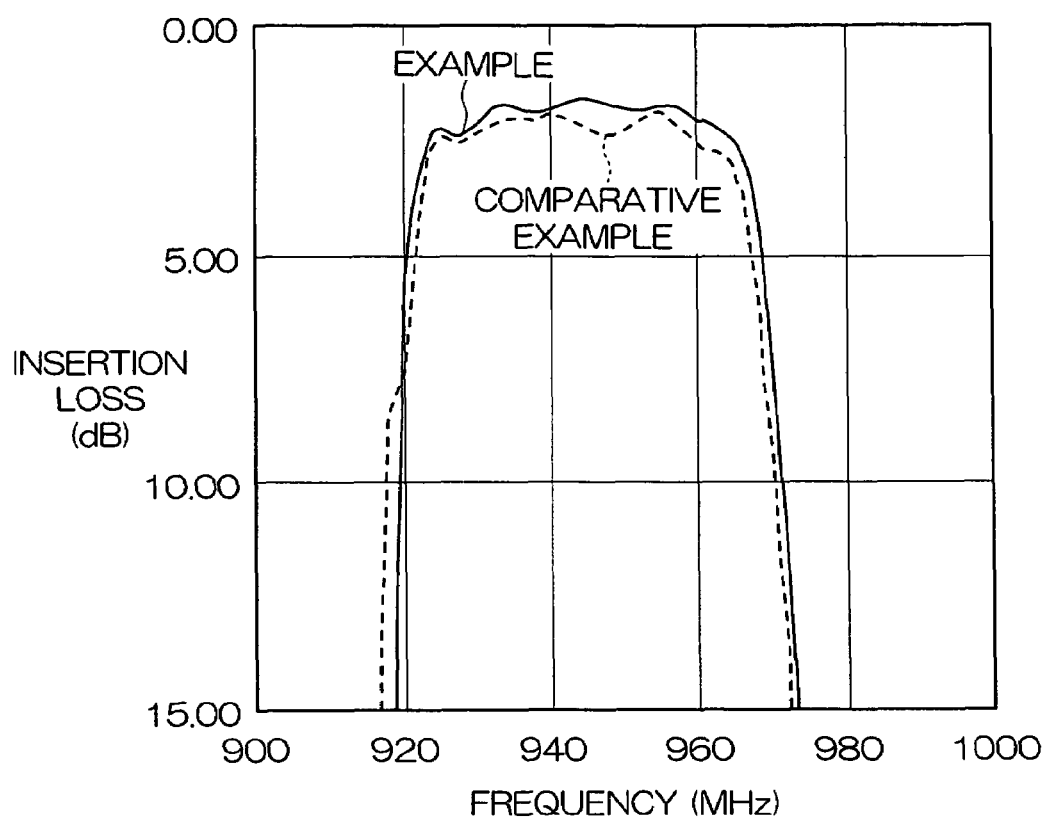
FIG. 9 is a graph respectively showing frequency characteristics of an insertion loss in a pass band and its vicinity with respect to an example and a comparative example of the present invention.

A graph of frequency characteristics in the vicinity of a pass band in the surface acoustic wave apparatus is shown in FIG. 9. FIG. 9 is a graph showing frequency dependency of an insertion loss representing filter transmission characteristics. The filter characteristics of the surface acoustic wave apparatus in this example were very good. That is, the surface acoustic wave apparatus in the present embodiment had an insertion loss of 1.76 dB, had a ripple of 0.20 dB, and had a fractional bandwidth of 4.9%, as indicated by a solid line in FIG. 9.

On the other hand, the surface acoustic wave apparatus in the comparative example had an insertion loss of 2.00 dB, had a ripple of 1.80 dB, and had a fractional bandwidth of 3.8%, as indicated by a broken line in FIG. 9.

In the present embodiment, it was thus possible to realize a surface acoustic wave apparatus having flatness and an insertion loss reduced while keeping the pass band wide.

EXAMPLE 2

A surface acoustic wave apparatus similar to that in the example 1 was manufactured.

The example 2 differs from the example 1 in that in a surface acoustic wave resonator in the surface acoustic wave apparatus in the example 2, an electrode finger pitch in adjacent IDT electrodes 3 and 4 in the vicinity of the boundary between the IDT electrode 3 and 4 have a profile as shown in FIG. 5. That is, the minimal electrode finger pitch portion C in two variable pitch sections L2 and L3 as shown in FIG. 5 has three minimal positions.

The average electrode finger pitch in the variable pitch section L2 on the side of the IDT electrode 3 was 2.01 µm, and the electrode finger pitch in the fixed pitch section L1 was set to 2.12 µm.

The average electrode finger pitch in the variable pitch section L3 on the side of the IDT electrode 4 was 2.05 µm, and the electrode finger pitch in the fixed pitch section L4 was set to 2.10 µm.

The minimum portion B in the minimal electrode finger pitch portion C was positioned offset by 1.94 µm toward the IDT electrode 3 on one side spaced apart from the boundary between the two adjacent IDT electrodes 3 and 4.

Figure 10:
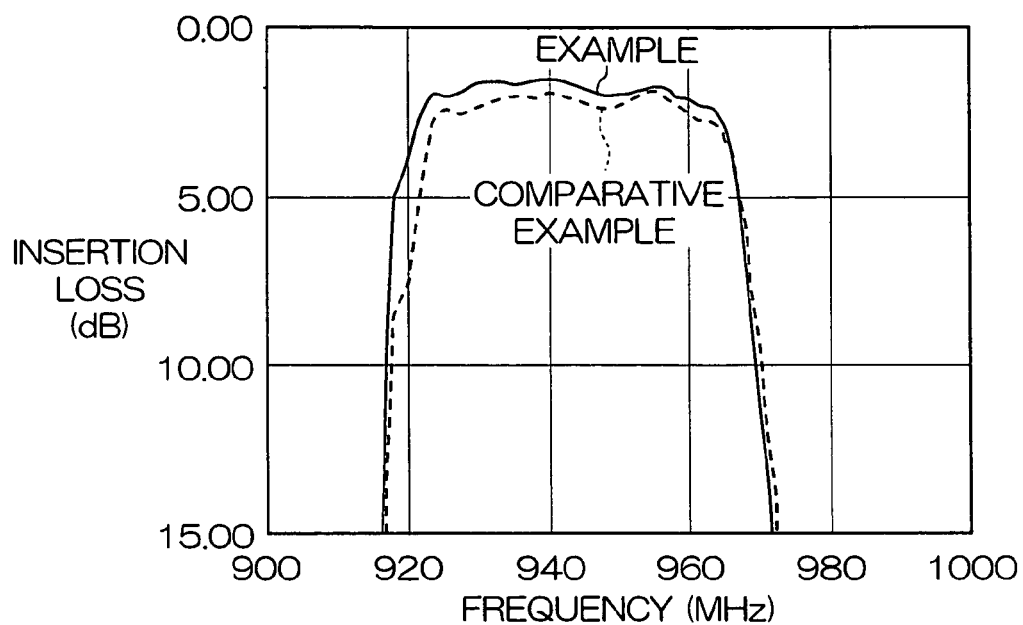
FIG. 10 is a graph respectively showing frequency characteristics of an insertion loss in a pass band and its vicinity with respect to an example and a comparative example of the present invention.

A graph of frequency characteristics in the vicinity of a pass band in the surface acoustic wave apparatus was shown in FIG. 10. FIG. 10 is a graph showing frequency dependency of an insertion loss representing filter transmission characteristics. The filter characteristics of the surface acoustic wave apparatus in this example were very good. That is, the surface acoustic wave apparatus in this example had an insertion loss of 1.74 dB, had a ripple of 0.20 dB, and had a fractional bandwidth of 4.9%, as indicated by a solid line in FIG. 10.

On the other hand, the surface acoustic wave apparatus in the comparative example had an insertion loss of 2.00 dB, had a ripple of 1.80 dB, and had a fractional bandwidth of 3.6%, as indicated by a broken line in FIG. 10.

In this example, it was thus possible to realize a surface acoustic wave apparatus having flatness and an insertion loss reduced while keeping the pass band wide.

EXAMPLE 3

A surface acoustic wave apparatus similar to that in the example 1 was then manufactured.

The example 3 differs from the example 1 in that the electrode finger pitch in adjacent IDT electrodes 3 and 4 in the vicinity of the boundary between the IDT electrode 3 and 4 in a surface acoustic wave resonator has a profile as shown in FIG. 7.

That is, the surface acoustic wave resonator has a wide pitch region D in a variable pitch section L3 on the side of the IDT electrode 4. Further, the maximum electrode finger pitch portion B in the two variable pitch sections L2 and L3 is positioned offset by 4.05 μm toward the IDT electrode 3 on one side spaced apart from the boundary between the two adjacent IDT electrodes 3 and 4.

Figure 11:
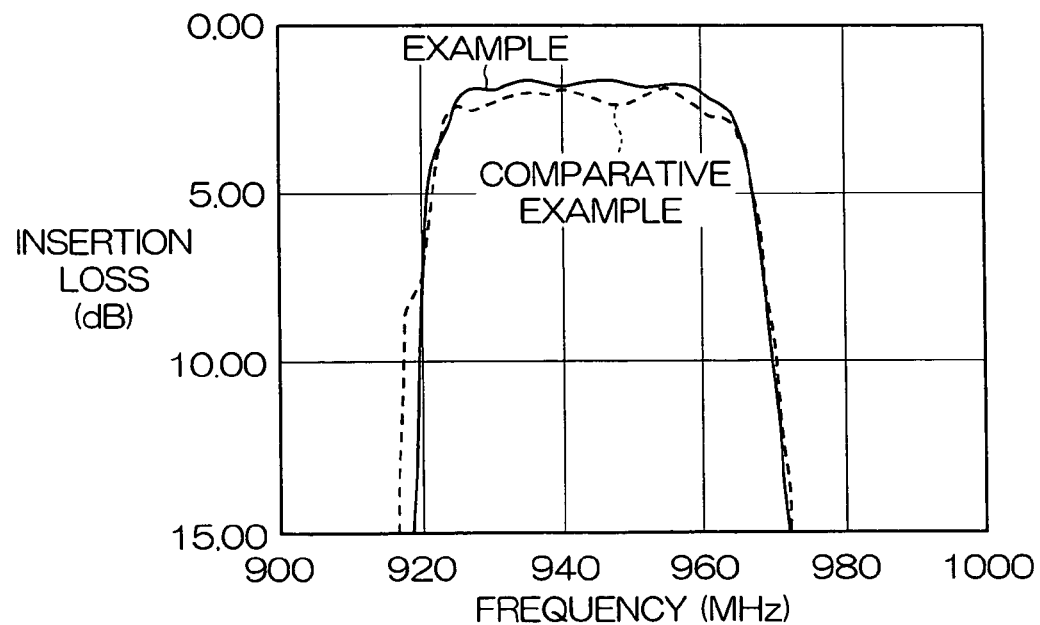
FIG. 11 is a graph respectively showing frequency characteristics of an insertion loss in a pass band and its vicinity with respect to an example and a comparative example of the present invention.
Figure 12:
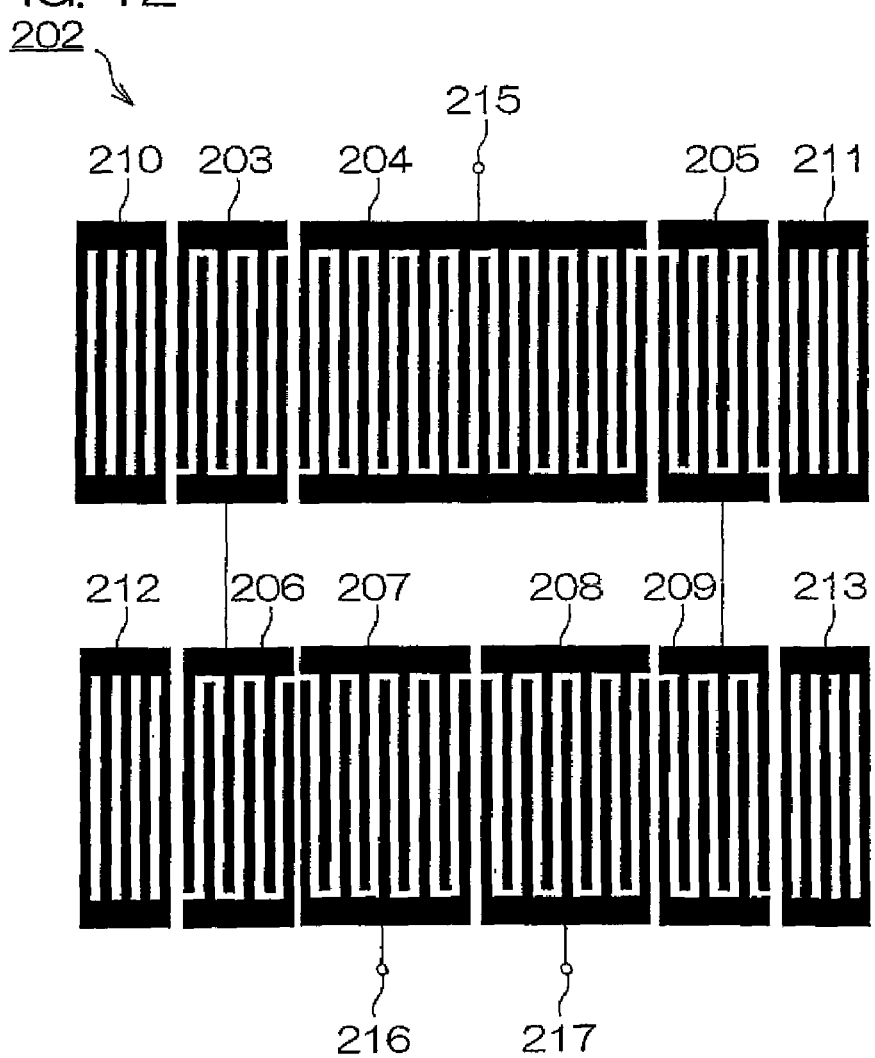
FIG. 12 is a plan view showing an electrode pattern in a conventional surface acoustic wave apparatus.
Figure 13:
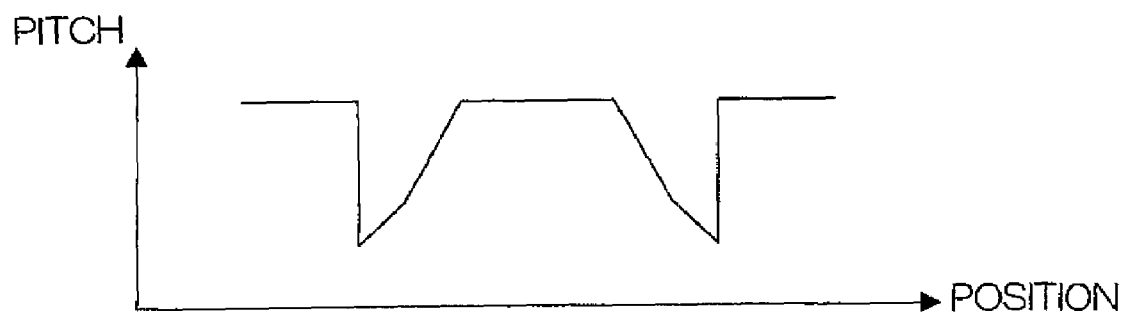
FIG. 13 is a graph showing the distribution of an electrode finger pitch in a conventional surface acoustic wave apparatus.

A graph of frequency characteristics in the vicinity of a pass band in the surface acoustic wave apparatus is shown in FIG. 11. FIG. 11 is a graph showing frequency dependency of an insertion loss representing filter transmission characteristics. The filter characteristics of the surface acoustic wave apparatus in this example were very good. That is, the surface acoustic wave apparatus in this example had an insertion loss of 1.79 dB, had a ripple of 0.20 dB, and had a fractional bandwidth of 4.9%, as indicated by a solid line in FIG. 11.

On the other hand, a surface acoustic wave apparatus in the comparative example had an insertion loss of 2.00 dB, had a ripple of 1.80 dB, and had a fractional bandwidth of 3.8%, as indicated by a broken line in FIG. 11.

In this example, it was thus possible to realize a surface acoustic wave apparatus having flatness and an insertion loss reduced while keeping the pass band wide.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A surface acoustic wave resonator comprising a plurality of IDT electrodes arranged on a piezoelectric substrate along a propagation direction of a surface acoustic wave propagating on the piezoelectric substrate and each having a number of electrode fingers extending in a direction perpendicular to the propagation direction,
wherein the IDT electrodes comprise a first IDT electrode and a second IDT electrode adjacent to the first IDT electrode, wherein both the first IDT electrode and second IDT electrode comprise a first pitch section and a second pitch section, wherein said second pitch section is closer to a boundary between than the first and second IDT electrodes than the first pitch section,
wherein the second pitch section of the first IDT electrode comprises a minimum pitch portion and a first non-minimum pitch portion,
wherein the minimum pitch portion has the shortest electrode finger pitch of the first and the second IDT electrodes, and
wherein the first non-minimum pitch portion is placed closer to the boundary between the first and the second IDT electrodes than the minimum pitch portion.

2. The surface acoustic wave resonator according to claim 1, wherein the first pitch section has a fixed electrode finger pitch and the second pitch section has variable electrode finger pitches.

3. The surface acoustic wave resonator according to claim 1, wherein the electrode finger pitch in the first pitch section of the first IDT electrode is longer than the electrode finger pitch in the first pitch section of the second IDT electrode.

4. The surface acoustic wave resonator according to claim 3, wherein the average electrode finger pitch in the second pitch section of the first IDT electrode is shorter than the average electrode finger pitch in the second pitch section of the second IDT electrode.

5. The surface acoustic wave resonator according to claim 1, wherein
the second pitch section of the first IDT electrode further comprises a second non-minimum pitch portion between the first pitch section of the first IDT electrode and the minimum pitch portion of the first IDT electrode.

6. The surface acoustic wave resonator according to claim 5, wherein
the second non-minimum pitch portion in the second pitch section of the first IDT electrode comprises a first local minimum pitch portion having a longer electrode finger pitch than the minimum pitch portion, and
wherein the second pitch section of the second IDT electrode comprises a second local minimum pitch portion having a longer electrode finger pitch than the minimum pitch portion.

7. The surface acoustic wave resonator according to claim 6, wherein
the second pitch section of the second IDT electrode further comprises a non-local-minimum pitch portion placed closer to the boundary between the first and the second IDT electrodes than the second local minimum pitch portion, wherein the non-local-minimum pitch portion has a longer electrode finger pitch than the second local minimum pitch portion.

8. A surface acoustic wave apparatus, wherein
a surface acoustic wave resonator for generating one or more mode resonances is connected to the surface acoustic wave resonator according to claim 1.

9. A surface acoustic wave apparatus in which the surface acoustic wave resonators according to claim 1 are two-stage cascade-connected.

10. Communications equipment comprising at least one of a receiving circuit and a transmission circuit, wherein the surface acoustic wave resonator according to claim 1 is carried thereon.

11. The surface acoustic wave resonator according to claim 5, wherein the electrode finger pitch in the second non-minimum pitch portion decreases toward the minimum pitch portion.

12. The surface acoustic wave resonator according to claim 5, wherein the electrode finger pitch in the first non-minimum pitch portion increases toward the boundary between the first and the second IDT electrodes.

13. The surface acoustic wave resonator according to claim 1, wherein
at least one of the first and the second IDT electrodes comprises a wide pitch region in the second pitch section thereof, and the wide region has a wider electrode finger pitch than the electrode finger pitch in the first pitch section thereof.

14. A surface acoustic wave apparatus having the surface acoustic wave resonator according to claim 1, and an input/output terminal connected to the surface acoustic wave resonator.

15. The surface acoustic wave resonator according to claim 1, wherein the second pitch section has an average electrode finger pitch shorter than the average electrode finger pitch of the first pitch section.

\* \* \* \* \*